US010811839B1

(12) United States Patent
Ho et al.

(10) Patent No.: US 10,811,839 B1
(45) Date of Patent: Oct. 20, 2020

(54) TO CAN LASER ASSEMBLY WITH OFF-CENTER LENS CAP AND AN OPTICAL TRANSCEIVER OR TRANSMITTER IMPLEMENTING SAME

(71) Applicant: Applied Optoelectronics, Inc., Sugar Land, TX (US)

(72) Inventors: I-Lung Ho, Sugar Land, TX (US); Chong Wang, Stafford, TX (US); Shih-Chia Liu, Sugar Land, TX (US)

(73) Assignee: Applied Optoelectronics, Inc., Sugar Land, TX (US)

(*) Notice: Subject to any disclaimer, the term of this patent is extended or adjusted under 35 U.S.C. 154(b) by 0 days.

(21) Appl. No.: 16/387,805

(22) Filed: Apr. 18, 2019

(51) Int. Cl.
*G02B 6/12* (2006.01)
*H01S 5/022* (2006.01)
*H01S 5/026* (2006.01)
*H04B 10/50* (2013.01)
*H04B 10/40* (2013.01)

(52) U.S. Cl.
CPC ........ *H01S 5/02252* (2013.01); *H01S 5/0267* (2013.01); *H01S 5/02212* (2013.01); *H04B 10/40* (2013.01); *H04B 10/505* (2013.01)

(58) Field of Classification Search
CPC ..... H01S 5/02212; G02B 6/12; G02B 6/4214; G02B 6/42
See application file for complete search history.

(56) References Cited

U.S. PATENT DOCUMENTS 6,668,113 B2 * 12/2003 Togami ............... G02B 6/4214
385/31
9,276,376 B2 * 3/2016 Oh ...................... G02B 6/4271

* cited by examiner

*Primary Examiner* — Jennifer Doan
(74) *Attorney, Agent, or Firm* — Grossman Tucker Perreault & Pfleger, PLLC; Stephan N. Kinsella

(57) ABSTRACT

The present disclosure is generally directed to a TO can laser package that includes an off-center focus lens integrated into a lens cap to compensate displacement of an associated laser diode. The TO can laser package includes a TO header with a mounting structure for directly electrically coupling an associated laser diode to electrical leads/pins without the use of an intermediate interconnect. The mounting structure displaces the laser diode such that an emission surface, and more particularly, an origin thereof, is displaced/offset relative to a center of the TO header. The integrated lens cap includes a focus lens with an optical center that is offset from a center of the TO header at a distance that is substantially equal to the displacement of the laser diode. Thus, the displacement of the laser diode is compensated for by the off-center focus lens to minimize or otherwise reduce optical misalignment.

18 Claims, 9 Drawing Sheets

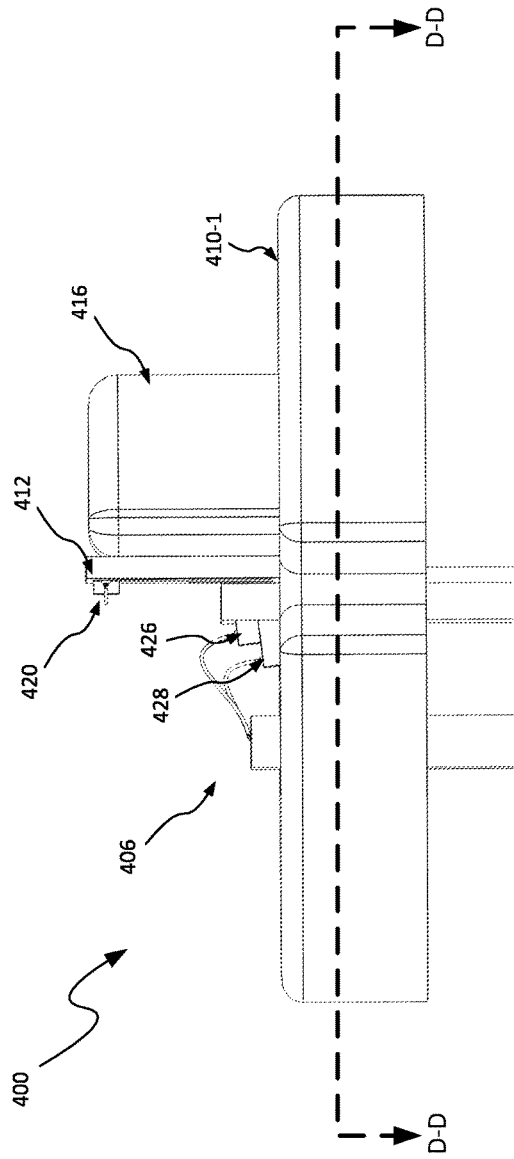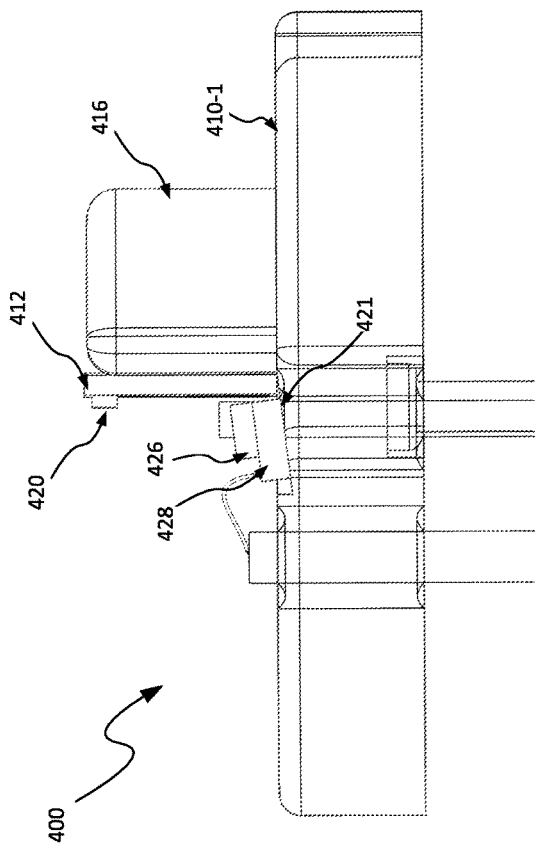

TO CAN LASER ASSEMBLY WITH OFF-CENTER LENS CAP AND AN OPTICAL TRANSCEIVER OR TRANSMITTER IMPLEMENTING SAME

TECHNICAL FIELD

The present disclosure relates to laser packages, and more particularly, to a TO can laser assembly having a lens cap to provide an off-center focus lens to compensate for displacement of an associated laser diode.

BACKGROUND INFORMATION

Optical transceivers are used to transmit and receive optical signals for various applications including, without limitation, internet data center, cable TV broadband, and fiber to the home (FTTH) applications. Optical transceivers provide higher speeds and bandwidth over longer distances, for example, as compared to transmission over copper cables. The desire to provide higher speeds in smaller optical transceiver modules for a lower cost has presented challenges, for example, with respect to maintaining optical efficiency (power), thermal management, insertion loss, and manufacturing yield.

Optical transceiver modules can include one or more transmitter optical subassemblies (TOSAs) and receiver optical subassemblies (ROSAs). TOSAs, for example, can include a plurality of transistor outline (TO) can laser packages, and can also provide electrical connections and optical couplings to the laser diode within those laser packages. Industry standards govern the design and dimensions of TO can laser packages. For example, industry standards define TO header widths/dimensions as well as the number, position, and width of leads/pins that extend from the TO header for electrical coupling with external driving circuitry. Therefore, TO can laser package designs seek to comport with applicable industry standards while also meeting nominal performance requirements. However, the continued development of TO can laser assemblies for applications such as high-speed, long distance communication depend at least in part overcoming packaging constraints that raise numerous non-trivial challenges.

BRIEF DESCRIPTION OF THE DRAWINGS

These and other features and advantages will be better understood by reading the following detailed description, taken together with the drawings wherein:

FIG. 4C shows a side view of the TO can laser assembly of FIG. 4A in accordance with an embodiment.

FIG. 4D is a cross-sectional view of the TO can laser assembly of FIG. 4C taken along line D-D, in accordance with an embodiment of the present disclosure.

DETAILED DESCRIPTION

As discussed above, industry standards govern the design of TO can packages. TO can packages can generally include three structural components, namely a TO header, leads/pins, and TO cap. The TO header provides mounting surfaces and ensures that components receive electrical power and signaling, e.g., via the leads, to modulate laser output. On the other hand, the TO cap aids in ensuring nominal transmission of optical signals and in some cases provides a lens to focus an output light beam. However, obstructions such as pins/leads complicate component placement which can lead to less than ideal placement of components, such as placement of a laser diode in an off-center position such that channel wavelengths get launched from an origin which is offset from a center of the TO header. This challenge may be better understood by example. FIG. 4B shows a TO header with direct coupling between the leads 406 and the conductive traces 422 of the laser diode (LD) submount 412. Direct electrical coupling eliminates the necessity of an interconnect such as wire bonds, which by extension can eliminate/reduce impedance mismatch and time of flight (TOF) issues. However, such direct coupling causes the laser diode 420 to be displaced/offset such that channel wavelengths emit from an origin which is offset from a center of the associated TO header, and more importantly, emitted from an origin that is offset from an optical axis of an associated focus lens within a TO lens cap.

Figure 1:
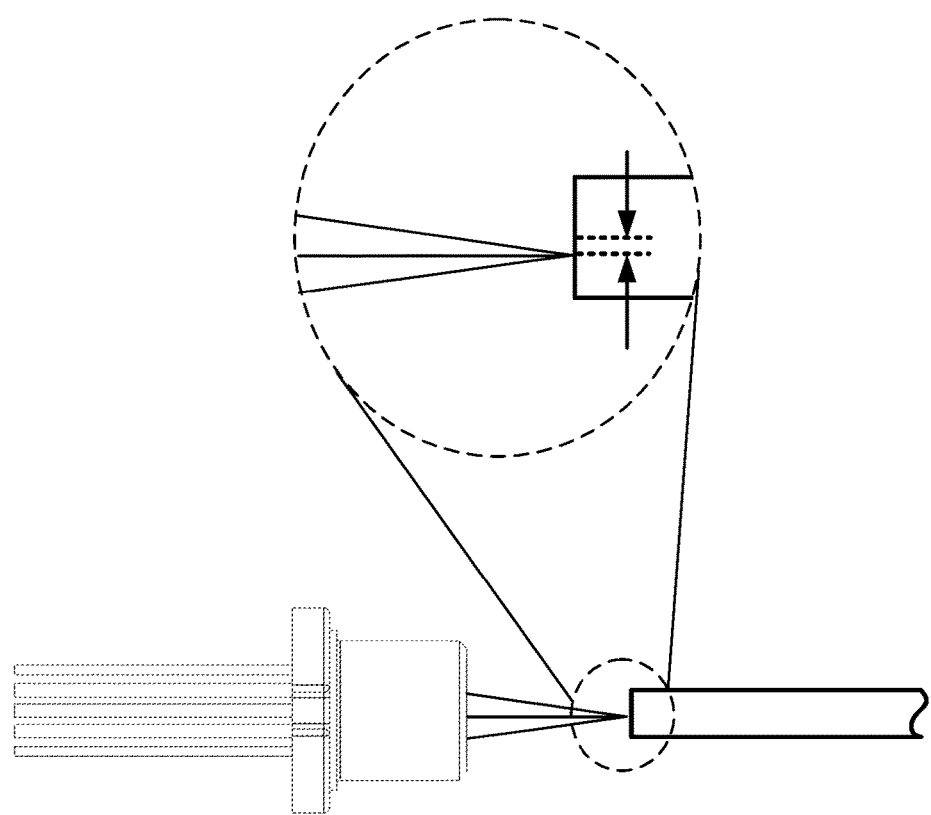
FIG. 1 shows an example approach for optically coupling a TO can laser package to an optical waveguide.

FIG. 1 demonstrates a highly-simplified example of the result during transmitter/transceiver operation. As shown, a light cone emitted from the TO can, and more particularly a focal point thereof, is offset by a relatively small distance of, for example, 70 microns, from a center of the optical fiber as a result of a 70 micron misalignment between the origin of the emitted channel wavelengths and the optical center of the TO lens cap. In turn, channel wavelengths then launch into the optical fiber at about 70 microns from its center. Even a relatively tiny misalignment significantly degrades signal quality, and can lead to redesigns of a TOSA to include additional optical components and/or corrective placement of an associated waveguide to reduce optical power losses. Unfortunately, variations in TO can laser packages that occur based on different manufacturers and/or TO can types can necessitate multiple design-and-retest iterations of a TOSA for each desired type of TO can laser assembly, which can significantly increase cost and complexity, and ultimately reduce yield.

Thus, the present disclosure is generally directed to a TO can laser package that includes an off-center focus lens integrated into a TO lens cap to compensate displacement of an associated laser diode. The term "off-center focus lens" in the context of a TO lens cap consistent with the present disclosure generally refers to a TO lens cap that, when coupled to an associated TO header, has an optical center that is offset from a center of the TO header. The amount of offset may be predetermined based on the offset of a laser diode relative to the center of the TO header. The offset distance of the off-center focus relative to the center of the TO header may be achieved based at least in part on the lens cap being physically coupled/mounted to the TO header at an off-center position, or based at least in part on the lens being disposed into the lens cap at an off-center position (e.g., the optical axis of the lens and the center of the lens cap are offset relative to each other), or both.

In one specific example embodiment, the TO can laser package includes a TO header with a mounting structure for directly electrically coupling an associated laser diode to electrical leads/pins without the use of an intermediate interconnect such as wire bonding. The mounting structure displaces the laser diode such that an emission surface (or emission face), and more particularly, an origin thereof, is displaced relative to a center of the TO header by, for example, 10-70 microns. The integrated lens cap includes a focus lens with an optical center that is offset from a center of the TO header at a distance that is substantially equal to the displacement of the laser diode. Thus, the displacement of the laser diode is compensated for by the off-center focus lens to minimize or otherwise reduce optical misalignment that could cause an emitted light beam to tilt/shift (e.g., such as shown in the example of FIG. 1).

The aforementioned displacement of the laser diode can cause a proportional shift in the position of the focal point for light emitted through the lens cap. The nominal tolerance for focal point placement is application-specific, but for purposes of illustration may be understood to be about 200 microns (or 0.2 mm) in one non-limiting example. The off-center focus lens disclosed herein may be utilized to ensure that the focal point remains within such a tolerance.

Accordingly, a TO can laser package consistent with the present disclosure can achieve relatively long-distance transmissions in excess of 10 kilometers, for example. In addition, the TO can laser package comports with industry standards and may be used to replace non-compensated TO can laser packages in a TOSA housing with minor modification.

While the present disclosure specifically illustrates and describes a Ø5.6 mm TO can laser package, this disclosure is not limited in this regard. The teachings disclosed herein are equally applicable to other TO can laser package configurations such as Ø3.8 mm, Ø5.6 mm, and Ø9 mm TO cans. Likewise, while the present disclosure specifically shows and describes a 4-channel transceiver capable of sending and receiving at 100 Gbps, other embodiments are within the scope of this disclosure.

As used herein, "optical center" refers to the point on a principal (or optical) axis of a lens for which the incident direction of a light ray passing through is parallel to the emergent direction. The optical center is not necessarily the physical center of a lens, and is instead a function of the composition and geometries of the particular lens.

As used herein, "channel wavelengths" refer to the wavelengths associated with optical channels and may include a specified wavelength band around a center wavelength. In one example, the channel wavelengths may be defined by an International Telecommunication (ITU) standard such as the ITU-T dense wavelength division multiplexing (DWDM) grid. The term "coupled" as used herein refers to any connection, coupling, link or the like and "optically coupled" refers to coupling such that light from one element is imparted to another element. Such "coupled" devices are not necessarily directly connected to one another and may be separated by intermediate components or devices that may manipulate or modify such signals.

The term substantially, as generally used herein, refers to a degree of precision within acceptable tolerance that accounts for and reflects minor real-world variation due to material composition, material defects, and/or limitations/peculiarities in manufacturing processes. Such variation may therefore be said to achieve largely, but not necessarily wholly, the stated/nominal characteristic. To provide one non-limiting numerical example to quantify "substantially," such a modifier is intended to include minor variation that can cause a deviation of up to and including ±5% from a particular stated quality/characteristic unless otherwise provided by the present disclosure.

Figure 2:
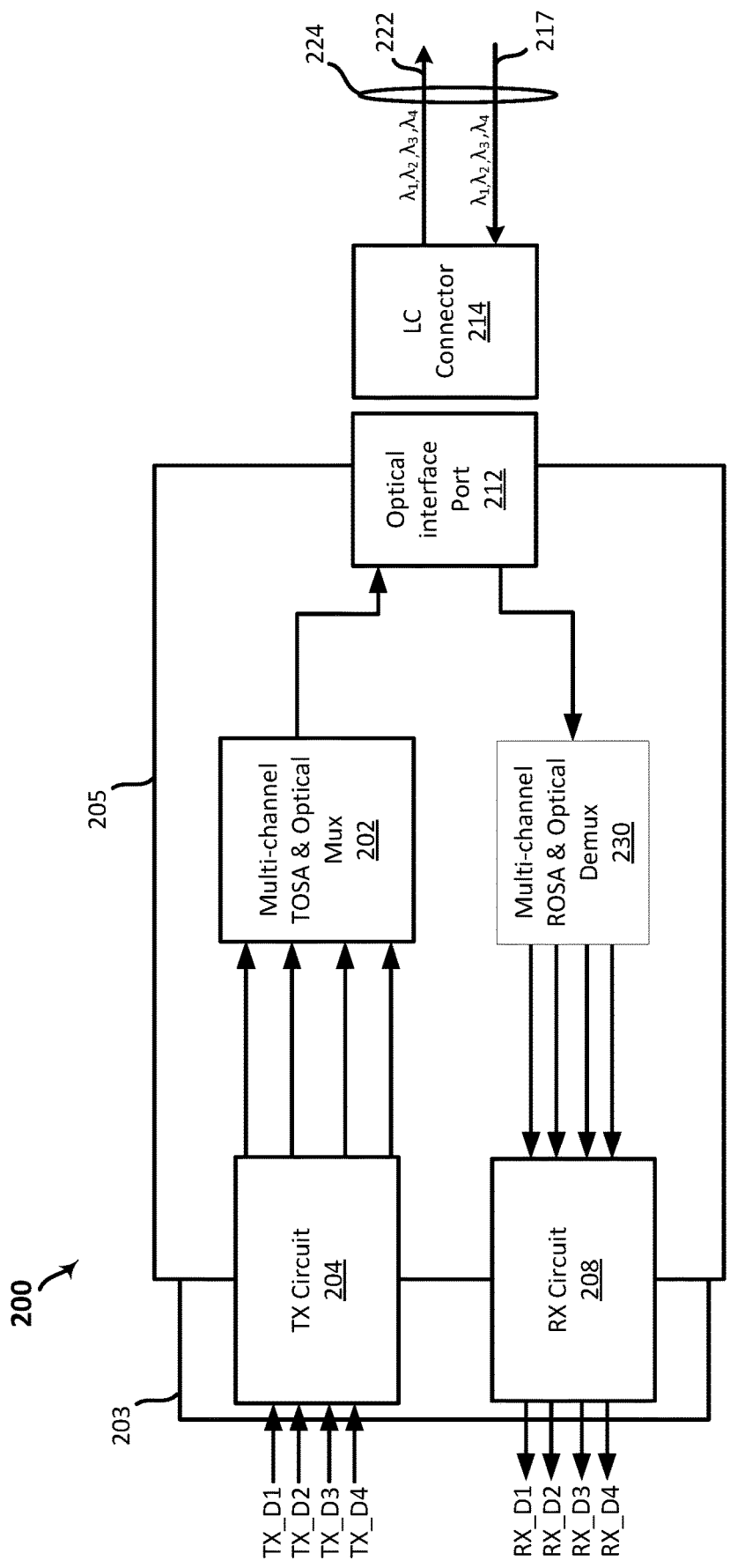
FIG. 2 schematically illustrates an example optical transceiver including a multi-channel TOSA and multi-channel ROSA consistent with the present disclosure.

Now turning to FIG. 2 there is an optical transceiver 200 consistent with embodiments of the present disclosure. In more detail, the optical transceiver 200 transmits and receives four (4) channels using four different channel wavelengths ($\lambda_1$, $\lambda_2$, $\lambda_3$, $\lambda_4$) and may be capable of transmission rates of at least about 10 Gbps per channel, and preferably 25 Gbps per channel. In one example, the channel wavelengths $\lambda_1$, $\lambda_2$, $\lambda_3$, $\lambda_4$ may be 1270 nm, 1290 nm, 1310 nm, and 1330 nm, respectively. The optical transceiver 200 may also be capable of transmission distances of 2 km to at least about 10 km. The optical transceiver 200 may be used, for example, in internet data center applications or fiber to the home (FTTH) applications.

Note while the example embodiment of FIG. 2 shows a 4-channel optical transceiver, this disclosure is not limited in this regard. An off-center lens cap consistent with the present disclosure may be utilized in, for instance, single-channel transceivers/transmitters. Some example applications particularly well suited for use with the off-center lens cap disclosed herein include small form-factor pluggable, SPF+, and SPF28.

This embodiment of the optical transceiver 200 includes a multi-channel TOSA 202 for transmitting optical signals on different channel wavelengths and a multi-channel receiver optical subassembly (ROSA) 230 for receiving optical signals on different channel wavelengths. The multi-channel TOSA 202 and the multi-channel ROSA 230 are located in a transceiver housing 205. A transmit connecting circuit 204 and a receive connecting circuit 208 provide electrical connections to the multi-channel TOSA 202 and the multi-channel ROSA 230, respectively, within the housing 205 and communicate with external systems via data bus 203.

In any event, the transmit connecting circuit 204 is electrically connected to the electronic components (e.g., TO can laser packages) in the multi-channel TOSA 202, and the receive connecting circuit 208 is electrically connected to the electronic components (e.g., the photodiode packages) in the multi-channel ROSA 230. The transmit connecting circuit 204 and the receive connecting circuit 208 include at least conductive paths to provide electrical connections and may also include additional circuitry. The multi-channel TOSA 202 transmits and multiplexes multiple channel wavelengths and is coupled to an optical interface port 212. The optical interface port 212 may comprise an LC connector receptacle, although other connector types are also within the scope of this disclosure. For example, the optical interface port 212 may comprise a multi-fiber push on (MPO) connector receptacle.

In cases where the optical interface port 212 comprises a duplex, or bi-directional, LC receptacle, the LC connector receptacle provides optical connections to the multi-channel TOSA 202 and provides optical connections to the multi-channel ROSA 230. The LC connector receptacle may be configured to receive and be coupled to a mating LC connector 214 such that the transmit optical fiber 222 of the external fibers 224 optically couples to the multi-channel TOSA 202, and the receive optical fiber 217 of the external fibers 224 optically couples to the multi-channel ROSA 230.

The multi-channel TOSA 202 includes multiple TO can laser packages, discussed in greater detail below, and optics for producing assigned channel wavelengths and coupling the same into the transmit optical fiber 222. In particular, the lasers in the multi-channel TOSA 202 convert electrical data signals (TX_D1 to TX_D4) received via the transmit connecting circuit 204 into modulated optical signals transmitted over the transmit optical fiber 222. The lasers may include, for example, distributed feedback (DFB) lasers with diffraction gratings. The multi-channel TOSA 202 may also include monitor photodiodes for monitoring the light emitted by the lasers. The multi-channel TOSA 202 may further include one or more temperature control devices, such as a resistive heater and/or a thermoelectric cooler (TEC), for controlling a temperature of the lasers, for example, to control or stabilize the laser wavelengths.

The multi-channel ROSA 230 includes, for example, photodiodes, mirrors and filters that can de-multiplex different channel wavelengths in a received optical signal. The multi-channel ROSA 230 can detect, amplify, and convert such optical signals received from the external optical fibers 224, and can provide the converted optical signals as electrical data signals (RX_D1 to RX_D4) that are output via the receive connecting circuit 208.

This embodiment of the optical transceiver 200 includes 4 channels and may be configured for coarse wavelength division multiplexing (CWDM), although other numbers of channels are possible.

Figure 3:
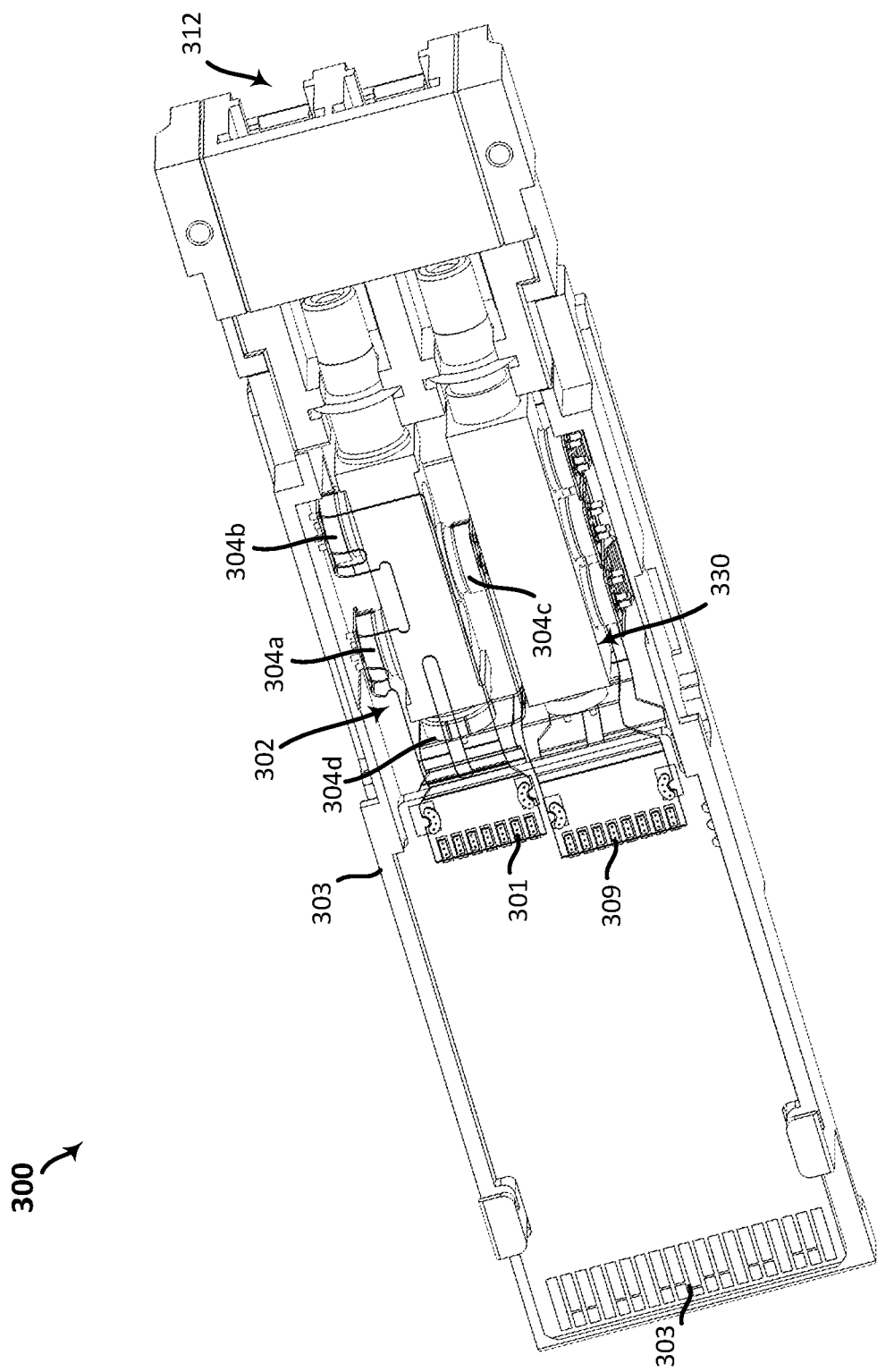
FIG. 3 is a perspective view of an example small form-factor (SFF) pluggable transceiver, in accordance with an embodiment of the present disclosure.

Referring to FIG. 3, an example small form-factor (SFF) pluggable optical transceiver 300 with a multi-channel TOSA including TO can laser packages and multi-channel ROSA is described and shown in greater detail. The embodiment shown in FIG. 3 is one example of the optical transceiver 200 of FIG. 2 implemented in a small form-factor. For example, the optical transceiver 300 may implement the QSFP+ specification. The optical transceiver 300 includes the transceiver housing 303, a multi-channel TOSA 302 in one region of the housing 303, and a multi-channel ROSA 330 located in another region of the housing 303.

The multi-channel TOSA 302 is electrically connected to transmit flexible printed circuits (FPCs) 301 and optically coupled to the LC connector port 312 at an end of the housing 303. The multi-channel ROSA 330 is electrically connected to a receive flexible printed circuit (FPC) 309 and optically coupled to the LC connector port 312 at the end of the housing 303.

The multi-channel TOSA 302 includes TO can laser packages 304a, 304b, 304c, and 304d, with each containing optical components such as a laser diode and focus lens. As discussed in greater detail below, each of the TO can laser packages 304a-304d can include a lens cap with an off-center focus lens to increase maximum transmission distance and reduce optical coupling losses.

The TO can laser packages can provide, for example, output power from 1.85 mW to 2 W, although other output power is within the scope of this disclosure. The TO can laser packages may provide a broad spectrum of channel wavelengths, or configured to provide a relatively narrow spectrum of channel wavelengths such as a single channel wavelength. In some cases, the TO can laser packages provide center wavelengths 375 nm to 1650 nm, for example. In an embodiment, the TO can laser packages are Ø3.8 mm, Ø5.6 mm, or Ø9 mm TO cans, although other configurations are also within the scope of this disclosure. For instance, the TO can laser packages can include Ø9.5 mm and TO-46 cans.

Figure 4A:
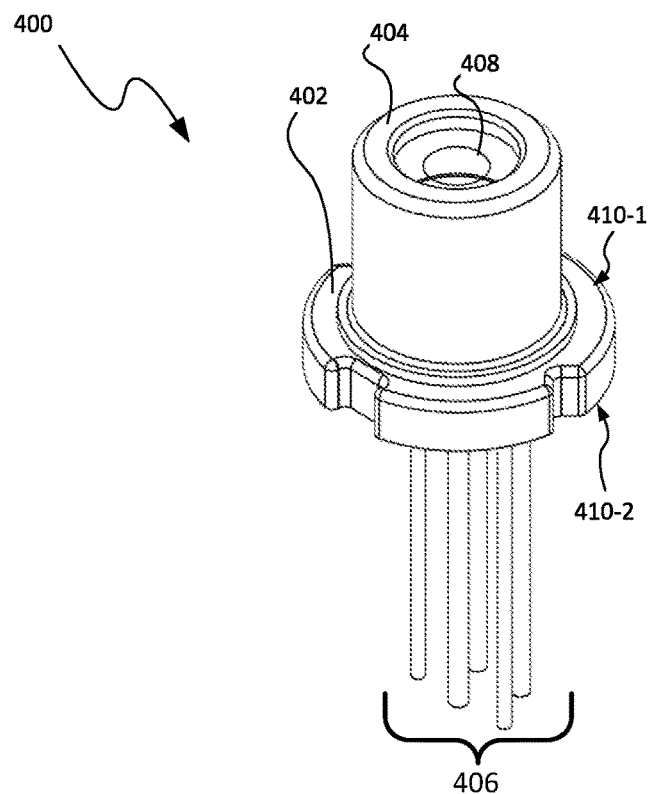
FIG. 4A is an embodiment of an example TO can laser assembly suitable for use in the multi-channel TOSA of the optical transceiver of FIG. 2.
Figure 4B:
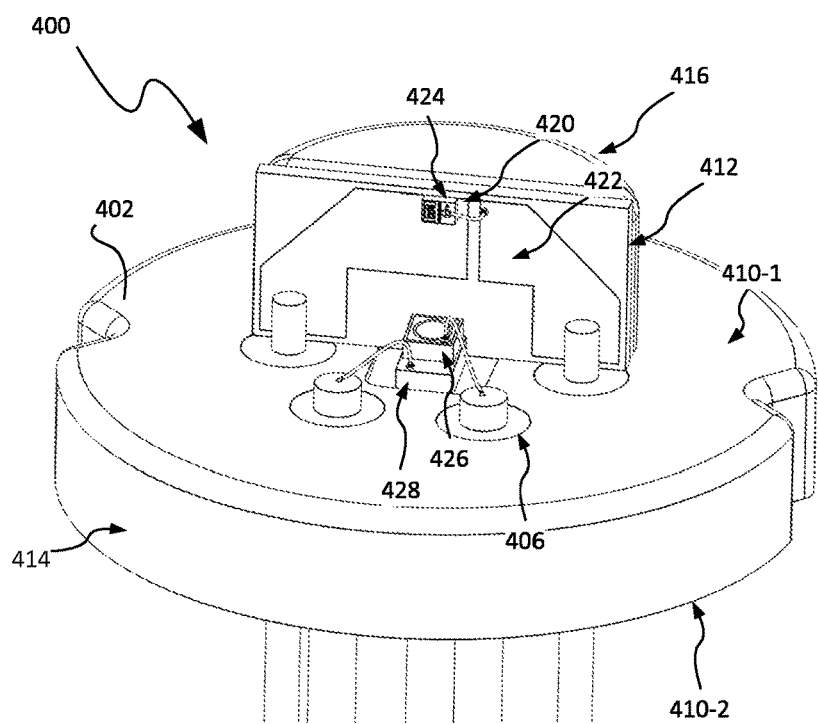
FIG. 4B shows the example TO can laser assembly of FIG. 4A partially exploded in accordance with an embodiment.

FIGS. 4A-4B show an example TO can laser package 400 consistent with the present disclosure. The TO can laser package 400 may be utilized by the multi-channel TOSA 302 discussed above. As shown, the TO can laser package 400 includes a TO header 402, which may also be referred to herein as simply a header or base 402, a plurality of leads/pins 406 extending from the TO header 402, and a TO lens cap 404, which may also be referred to herein as simply a lens cap 404. The lens cap 404 includes an off-center configuration to compensate for displacement of an associated laser diode, which will be discussed in greater detail further below. The header 402 and lens cap 404 collectively form a hermetically-sealed cavity when coupled together. While a hermetically-sealed TO can is particularly well suited for long-distance transmission, the present disclosure is not limited in this regard.

Referring to FIG. 4B, with additional reference to FIG. 4A, the TO can laser package 400 is shown partially exploded in accordance with an embodiment of the present disclosure. FIG. 4B illustrates the TO can laser package 400 with the lens cap 404 omitted for purposes of clarity and not limitation. As shown, the header 402 includes first and second surfaces 410-1, 410-2 that extend substantially parallel with each other and are adjoined by a substantially-cylindrical (or curved) sidewall 414 that extends substantially transverse to each. The first and second surfaces 410-1, 410-2, include a substantially flat profile (as shown), although other profiles are within the scope of this disclosure. The first surface 410-1 couples to and supports the lens cap 404 and other optical components, as discussed below, and for this reason the following disclosure also refers to the same as a mounting surface 410-1.

As further shown, the leads 406 extend through the header 402 and protrude/project from the mounting surface 410-1 to allow for electrical coupling between associated external LD driving circuitry (not shown) and the optical components of the TO can laser package 400. Proximate the leads 406, an laser diode (LD) mounting structure 416 extends from the mounting surface 410-1. The LD mounting structure 416 couples to and supports LD submount 412. The LD mounting structure 416 is defined at least in part by a curved wall that forms a substantially half-circle shape. LD submount 412 may comprise, for instance, a printed circuit board (PCB) or other suitable substrate. The LD submount 412 couples to and supports at least a laser diode 420 and conductive traces/paths 422. The laser diode 420 electrically couples to the conductive traces 422 via, for instance, wire bonding to complete an electrical circuit to allow for a driving radio frequency (RF) signal to modulate an optical signal output via the laser diode 420.

In this embodiment, the LD mounting structure 416 provides a mounting surface for the LD submount 412 that extends substantially transverse relative to the mounting surface 410-1. The laser diode 420 includes an emission face 424 that launches channel wavelengths along a light path that extends substantially parallel with the mounting surface of the LD mounting structure 416 and substantially transverse relative to the mounting surface 410-1. When coupled to the lens cap 404, this light path extends coaxially with the optical axis of the lens 408. In an embodiment, the LD mounting structure 416 and the LD submount 412 are dimensioned such that the conductive traces 422 are directly electrically coupling to associated leads of the plurality of leads 406. This direct electrical coupling advantageously allows for providing driving signals to the laser diode 420 without the use of an intermediate electrical interconnect device such as wire bonding. However, this direct electrical coupling results in the emission face 424 being displaced from a center of the header 402, and by extension, an optical center of the focus lens 408 when the same is aligned with the center of the header 402. Aspects consistent with the present disclosure include an off-center focus lens 408 to compensate for this displacement, which will be discussed in greater detail below.

Continuing on, the mounting surface 410-1 couples and supports monitor photodiode (MPD) 426 by way of PD submount 428. The MPD 426 monitors optical power of the laser diode 420 and forms a feedback loop for purposes of maintaining nominal power. The MPD 426 couples to associated leads of the plurality of leads 406 via, for instance, wire bonding. Note, the TO can laser package 400 can include other passive and/or active optical components depending on a desired configuration. For example, the TO can laser package 400 can include a thermoelectric cooler (TEC) for purposes of wavelength stabilization. To this end, the embodiment shown in FIGS. 4A-4B should not be construed as limiting.

FIGS. 4C-4D each show side views of the TO can laser package 400 consistent with an embodiment of the present disclosure. As shown, the mounting surface 410-1 includes a groove/notch 421 with an angled surface having an angle of about 8 degrees relative to the mounting surface 410-1. The angled surface can increase the amount of back-side emission into the MPD 426, and by extension, the quality of the signal used during monitoring.

Figure 5A:
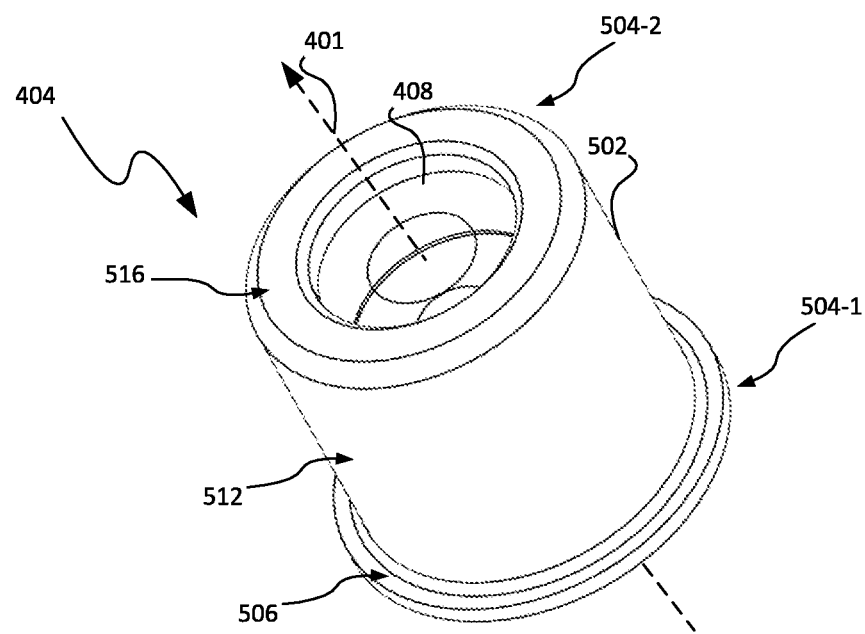
FIG. 5A shows an example perspective view of a TO lens cap suitable for use with the TO can laser assembly of FIG. 4A.
Figure 5B:
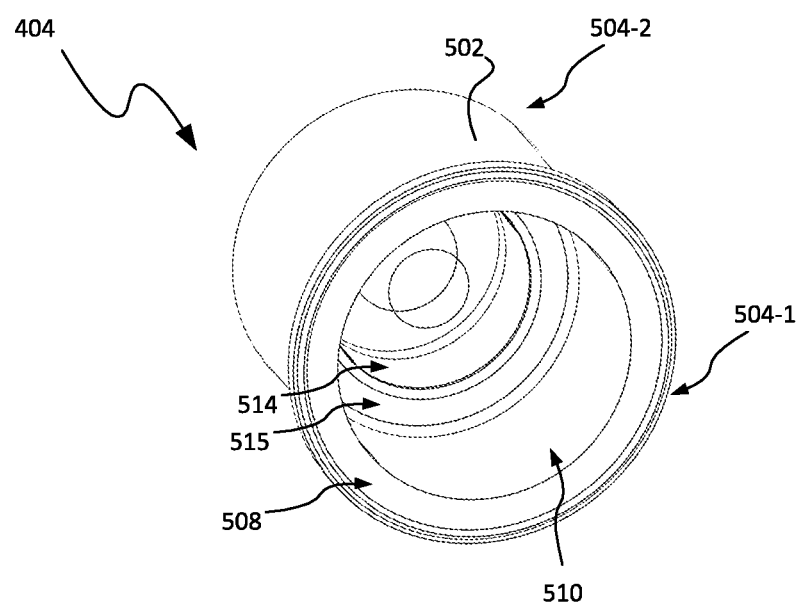
FIG. 5B shows another example perspective view of the TO lens cap of FIG. 5A in accordance with an embodiment of the present disclosure.

Turning to FIGS. 5A-5B, the lens cap 404 is shown in isolation in accordance with an embodiment. As shown, the lens cap 404 includes substantially cylindrical body 502 defined at least in part by a curved sidewall 512, referred to herein as simply sidewall 512, that extends from a first end 504-1 to a second end 504-2 and adjoins the two together. The sidewall 512 is also defined by an annular ring 506 disposed at a distal end, with the annular ring 506 providing a mating surface 508 for coupling to the mounting surface 410-1 (FIG. 4A). The mating surface 508 extends substantially transverse relative to the sidewall 512 to form a shoulder/flange. The annular ring 506 may further provide a structure well suited for welding or otherwise attaching the lens cap 404 to the header 402. The annular ring 506 may be formed integrally with the body 502 as a single piece or may be formed as separate pieces. The sidewall 512 defines at least a portion of the cavity 510, with the cavity 510 providing space for optical components such as the laser diode 420 when the lens cap 404 is coupled to the header 402.

The focus lens 408 may be disposed recessed into the body 502 (e.g., countersunk as shown), with the focus lens 408 defining at least a portion of the cavity 510. The focus lens 408 may be securely held at a predefined position based on a slot/groove 514 defined by the body 502. The slot/groove can provide an inner annular ring 515 with a surface that operates, in a general sense, as a stop such that the focus lens 408 securely held at a predefined position with the cavity 510. In some cases, the second end 504-2 of the body 502 includes a lens holder portion 516. The lens holder portion 516 may comprise an annular ring that couples to the second end 504-2 of the body 502 and presses against the focus lens 408 to cause the same to be sandwiched between the lens holder portion 516 and the inner annular ring 515.

Figure 6:
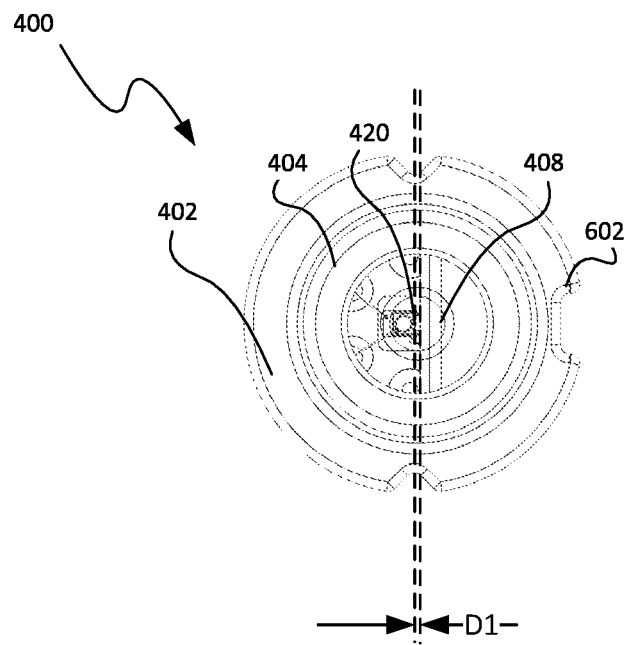
FIG. 6 shows a top view of the TO can laser assembly of FIG. 4A in accordance with an embodiment.

Turning to FIG. 6, a top view of the TO can laser package 400 is shown consistent with an embodiment of the present disclosure. As shown, the focus lens 408 includes an optical center with an off-center orientation/configuration. In particular, the optical center of the focus lens 408 is shifted/offset from the center of the header 402 by distance D1 towards the orientation groove 602, which in the embodiment of FIG. 6 indicates the position of ground. This offset is achieved at least in part by physically coupling the lens cap 404 at distance D1 from the longitudinal center of the header 402, with distance D1 being equal to the distance between the origin of the laser diode 420 and the center of the header 402. Alternatively, or in addition, the offset distance D1 may be achieved by having a focus lens 408 with an optical center, and by extension an optical axis, that is offset from the center of the lens cap 402. To this end, while the lens cap 402 may be mounted and aligned such that the longitudinal center line of the header 402 and the lens cap 402 are coaxially-aligned, the focus lens 408 can have an optical center which is offset by the predefined offset distance D1 based on the optical axis of the focus lens being offset by distance D1. In any such cases, the offset distance D1 advantageously allows for the origin of the emission face 424 of the laser diode 420 and the optical center of the focus lens 408 to be optically aligned to ensure nominal optical coupling efficiency. This optical alignment may also be described as providing a direct optical coupling, whereby light is emitted along the optical axis of the focus lens 408 without bends/turns along the path and without the necessity of an intermediate optical device or waveguide.

Stated differently, and consistent with an embodiment, the longitudinal center line 401 of the lens cap 404 (See FIG. 5A) and the optical center of the focus lens 408 may be substantially coaxially aligned such that an imaginary line drawn along the longitudinal center line 401 intersects with the optical center of the focus lens 408. In this embodiment, the longitudinal center line 401 of the lens cap 404, and by extension the optical center of the focus lens 408, can be offset from the longitudinal center line 702 of the header 402 (See FIG. 7) to provide the offset distance D1. Alternatively, the longitudinal center line 401 (FIG. 5A) of the lens cap 404 and the longitudinal center line 702 of the header 402 can be substantially coaxially aligned, and the optical center of the focus lens 408 of the lens cap 404 can be offset relative to the coaxially aligned longitudinal center lines of the header 402 and lens cap 404 to provide the offset distance D1.

Figure 7:
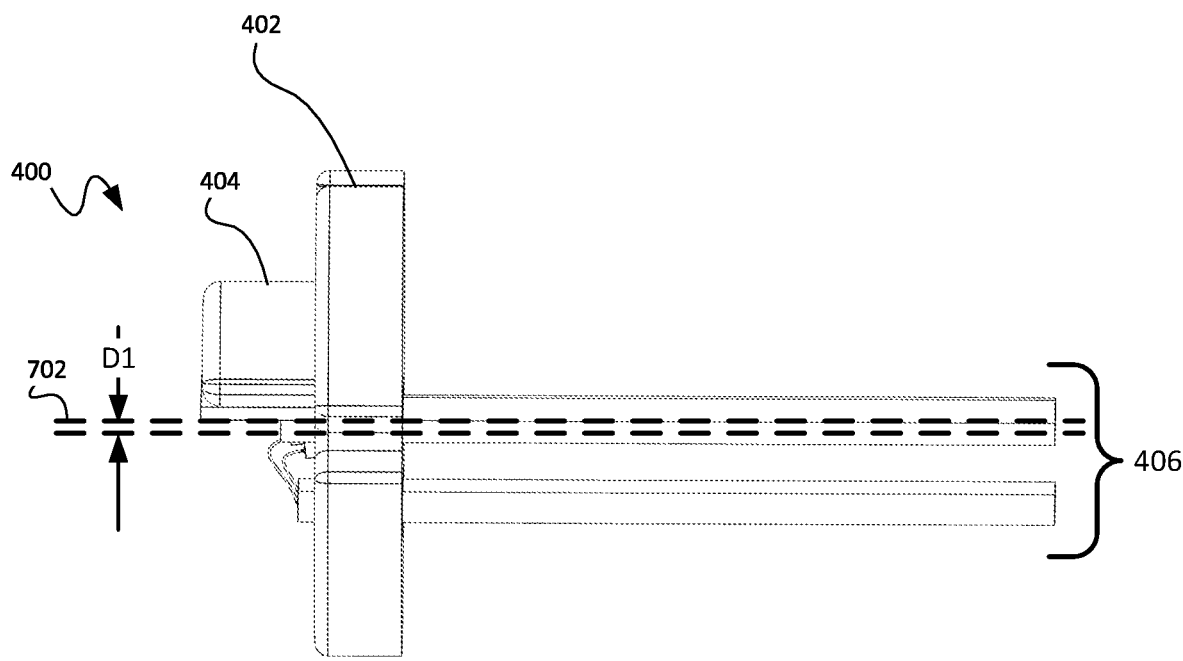
FIG. 7 shows another example side view of the TO can laser assembly of FIG. 4A in accordance with an embodiment of the present disclosure.

In an embodiment, D1 can measure from 10 microns or 0.01 millimeters (mm), to 100 microns or 0.1 mm, and preferably between 50 and 70 microns. The distance D1 may be selected to compensate for the displacement of the laser diode 420, and more particularly, an origin of an emission surface 424 of the laser diode 420 (See FIG. 4B). To this end, the specific example measurements for D1 are not intended to be limiting and other embodiments are within the scope of this disclosure. FIG. 7 shows a side-view of the TO can laser package 400 having the offset distance D1 between the optical center of the focus lens 408 and the center (represented by the longitudinal center line 702 of the header 402) of the TO can laser package 400.

Figure 8:
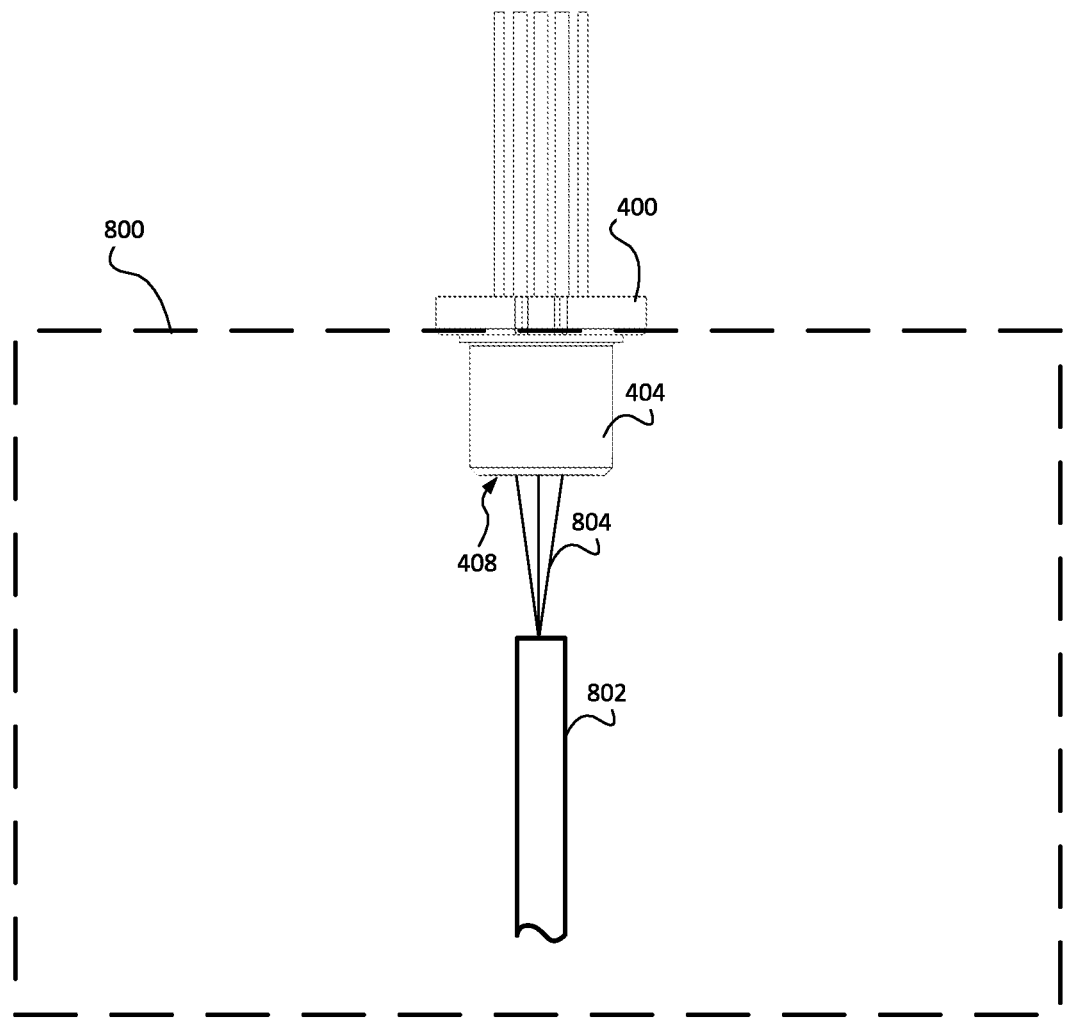
FIG. 8 shows an example embodiment of the TO can laser assembly of FIG. 4A coupled to a TOSA housing.

FIG. 8 is an example TO can laser package 400 consistent with the present disclosure coupled to a transmitter optical subassembly (TOSA) housing 800. The embodiment of FIG. 8 is shown in a highly simplified form for ease of description and clarity. As shown, the TO can laser package 400 couples to the housing 800 along a sidewall. The lens cap 404 includes an off-center configuration whereby the focus lens 408 is displaced relative to the center of the TO can laser assembly 400 to compensate for the offset placement of the laser diode 420. Thus, the lens cap 404 optically aligns with a waveguide 802, e.g., an optical fiber, such that associated channel wavelengths launched via output light cone 804 are launched on to substantially a center of the waveguide 802 without having to provide additional compensation within the TOSA housing 800.

Figure 9:
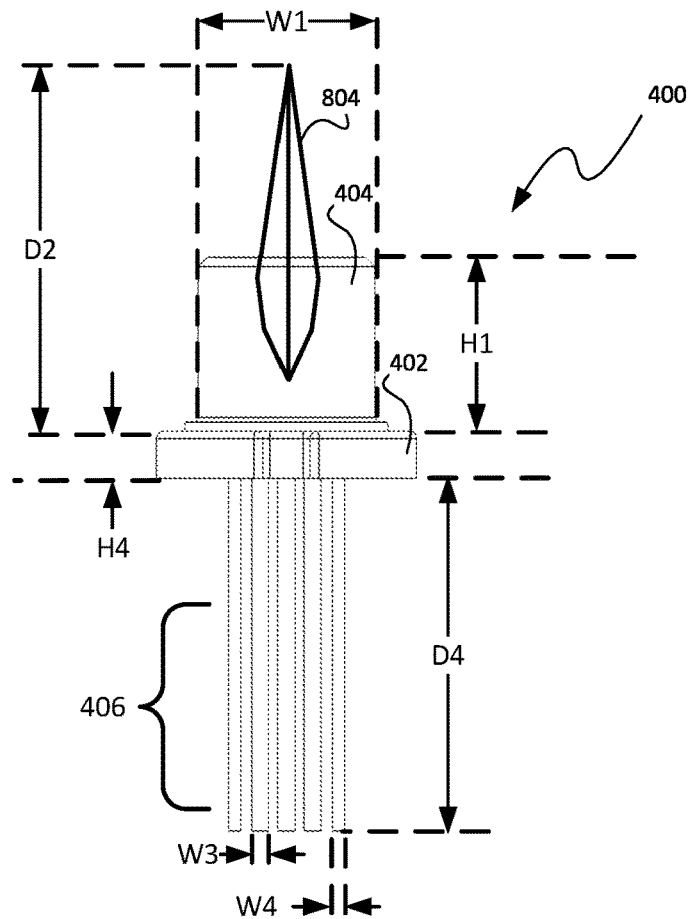
FIG. 9 shows another example side view of the TO can laser assembly of FIG. 4A in accordance with an embodiment of the present disclosure.
Figure 10:
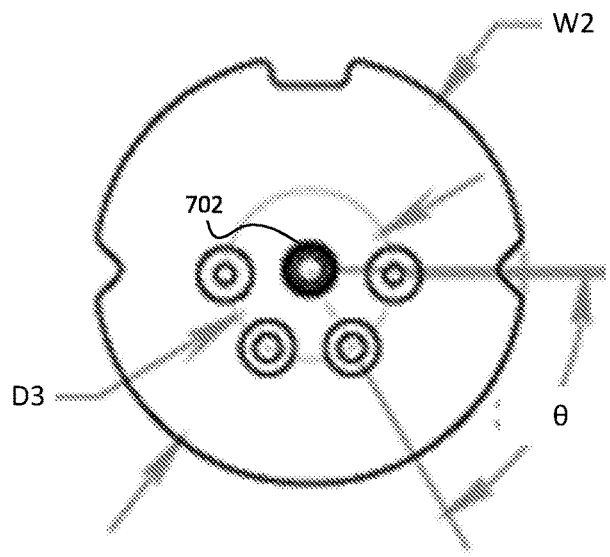
FIG. 10 shows an example bottom view of the TO can laser assembly of FIG. 4A in accordance with an embodiment of the present disclosure.

FIGS. 9 and 10 show another side view and top view, respectively, of the TO can laser package 400 in accordance with an embodiment. As shown, the lens cap 404 includes a width W1 of about 3.75 mm, an overall height H1 of 3.7 mm, and a light cone with a focal point that extends an overall distance D2 of about 7.5±5 mm from the header 402. The header 402 includes an overall height H4 of 1.0 mm and an overall width W2 of 5.6 mm. Each of the leads 406 are disposed about a circular pattern/guide with a diameter D3 of 2.2 mm. Each of the leads 406 are offset from each other by an angular distance of θ, with θ measuring about 60 degrees. The plurality of pins 406 extend from the header 402 to a distance of D4, with D4 being 7.5 mm.

Further Example Embodiments

In accordance with an aspect of the present disclosure a transistor outline (TO) laser diode package for use in a transmitter optical subassembly (TOSA) module is disclosed. The laser diode package comprising a TO header defined by first and second ends that extend substantially parallel relative to each other and substantially transverse relative to a curved sidewall adjoining the first and second ends, a laser diode coupled to the first end of the TO header, a TO lens cap coupled to the first end of the TO header, the lens cap defining a cavity with a focus lens disposed therein for focusing incident laser light emitted by the laser diode along an optical axis of the focus lens, and wherein the TO lens cap has an off-center configuration whereby the optical axis of the focus lens is offset by an offset distance D1 from a longitudinal center line of the TO header.

In accordance with another aspect of the present disclosure a laser diode package for use in a transmitter optical subassembly (TOSA) module is disclosed. The laser device package comprising a header defined by first and second ends that extend substantially parallel relative to each other and substantially transverse relative to a curved sidewall extending between the first and second ends, a mounting surface disposed at the first end of the header, a laser diode coupled to and supported by the mounting surface, the laser diode having an emission face with an origin from which the laser diode emits associated channel wavelengths, the origin being disposed at an offset distance of D1 relative the longitudinal center line of the header, a lens cap coupled to the mounting surface, the lens cap having a cavity defined by at least one sidewall, the at least one sidewall having a mating surface at a first end to couple the lens cap to the mounting surface of the header, wherein the lens cap includes a focus lens at a second end of the lens cap opposite the first end of the lens cap, the focus lens having an optical axis offset from the longitudinal center line of the first end of the header by the offset distance D1, and wherein the optical axis of the focusing lens is optically aligned with the origin of the emission face of the laser diode such that associated channel wavelengths emitted by the laser diode launch along the optical axis and intersect with the optical center of the focus lens.

In accordance with another aspect of the present disclosure an optical transceiver is disclosed. The optical transceiver comprising a transceiver housing, a transmitter optical subassembly (TOSA) having a plurality of transistor outline (TO) can laser packages, each of the TO can laser packages comprising a TO header defined by first and second ends that extend substantially parallel relative to each other and substantially transverse relative to a curved sidewall adjoining the first and second ends, a laser diode coupled to the first end of the TO header, a TO lens cap coupled to the first end of the TO header, the lens cap defining a cavity with a focus lens disposed therein for focusing laser light emitted by the laser diode, and wherein the TO lens cap has an off-center configuration whereby an optical center of the focus lens is offset by an offset distance D1 from a longitudinal center line of the TO header.

While the principles of the disclosure have been described herein, it is to be understood by those skilled in the art that this description is made only by way of example and not as a limitation as to the scope of the disclosure. Other embodiments are contemplated within the scope of the present disclosure in addition to the exemplary embodiments shown and described herein. Modifications and substitutions by one of ordinary skill in the art are considered to be within the scope of the present disclosure, which is not to be limited except by the following claims.

What is claimed is:

1. A transistor outline (TO) laser diode package for use in a transmitter optical subassembly (TOSA) module, the laser diode package comprising:
    a TO header defined by first and second ends that extend substantially parallel relative to each other and substantially transverse relative to a curved sidewall adjoining the first and second ends;
    a laser diode coupled to the first end of the TO header;
    a TO lens cap coupled to the first end of the TO header, the lens cap defining a cavity with a focus lens disposed therein for focusing incident laser light emitted by the laser diode along an optical axis of the focus lens; and
    wherein the TO lens cap has an off-center configuration whereby the optical axis of the focus lens is offset by an offset distance D1 from a longitudinal center line of the TO header.

2. The TO laser diode package of claim 1, wherein the longitudinal center line of the TO lens cap and the optical axis of the focus lens are coaxially aligned, and wherein the longitudinal center line of the TO lens cap is offset from the longitudinal center line of the TO header to provide the offset distance D1.

3. The TO laser diode package of claim 1, wherein the longitudinal center line of the TO lens cap and the longitudinal center line of the TO header are coaxially aligned, and wherein the optical axis of the focus lens of the TO lens cap is offset relative to the coaxially-aligned longitudinal center lines of the TO header and TO lens cap to provide the offset distance D1.

4. The TO laser diode package of claim 1, further comprising a laser diode submount disposed between the laser diode and the TO header.

5. The TO laser diode package of claim 4, further comprising a plurality of electrical leads extending through the TO header, and wherein the electrical leads directly electrically couple with the laser diode submount.

6. The TO laser diode package of claim 5, wherein the TO header further includes a laser diode mounting structure to couple to the laser diode submount, and wherein the laser diode submount is disposed between the plurality of electrical leads and the laser diode mounting structure.

7. The TO laser diode package of claim 1, wherein the laser diode includes an emission face having an origin from which associated channel wavelengths emit, and wherein the origin of the emission face is displaced from a longitudinal center line of the TO header by the offset distance D1.

8. The TO laser diode package of claim 1, wherein the cavity of the TO lens cap is hermetically sealed.

9. A laser diode package for use in a transmitter optical subassembly (TOSA) module, the laser device package comprising:
    a header defined by first and second ends that extend substantially parallel relative to each other and substantially transverse relative to a curved sidewall extending between the first and second ends;
    a mounting surface disposed at the first end of the header;
    a laser diode coupled to and supported by the mounting surface, the laser diode having an emission face with an origin from which the laser diode emits associated channel wavelengths, the origin being disposed at an offset distance of D1 relative the longitudinal center line of the header;
    a lens cap coupled to the mounting surface, the lens cap having a cavity defined by at least one sidewall, the at least one sidewall having a mating surface at a first end to couple the lens cap to the mounting surface of the header;
    wherein the lens cap includes a focus lens at a second end of the lens cap opposite the first end of the lens cap, the focus lens having an optical axis offset from the longitudinal center line of the first end of the header by the offset distance D1, and wherein the optical axis of the focusing lens is optically aligned with the origin of the emission face of the laser diode such that associated channel wavelengths emitted by the laser diode launch along the optical axis and intersect with the optical center of the focus lens.

10. The laser diode package of claim 9, further comprising a laser diode submount disposed between the laser diode and the header.

11. The TO laser package of claim 9, further comprising a plurality of electrical leads extending through the header, and wherein the plurality of electrical leads directly electrically couple with the laser diode submount.

12. The TO laser package of claim 10, wherein the header further includes a laser diode mounting structure to couple to the laser diode submount, and wherein the laser diode submount is disposed between the plurality of electrical leads and the laser diode mounting structure.

13. The TO laser package of claim 9, wherein the cavity of the lens cap is hermetically sealed.

14. An optical transceiver comprising:
    a transceiver housing;
    a transmitter optical subassembly (TOSA) having a plurality of transistor outline (TO) can laser packages, each of the TO can laser packages comprising:
        a TO header defined by first and second ends that extend substantially parallel relative to each other and substantially transverse relative to a curved sidewall adjoining the first and second ends;
        a laser diode coupled to the first end of the TO header;
        a TO lens cap coupled to the first end of the TO header, the lens cap defining a cavity with a focus lens disposed therein for focusing laser light emitted by the laser diode; and
        wherein the TO lens cap has an off-center configuration whereby an optical center of the focus lens is offset by an offset distance D1 from a longitudinal center line of the TO header.

15. The optical transceiver of claim 14, wherein the longitudinal center line of the TO lens cap and an optical axis of the focus lens are coaxially aligned, and wherein the longitudinal center line of the TO lens cap is offset from the longitudinal center line of the TO header to provide the offset distance D1.

16. The optical transceiver of claim 14, wherein the longitudinal center line of the TO lens cap and the longitudinal center line of the TO header are coaxially aligned, and wherein the optical center of the focus lens of the TO lens cap is offset relative to the coaxially aligned longitudinal center lines of the TO header and TO lens cap to provide the offset distance D1.

17. The optical transceiver of claim 14, further comprising a laser diode submount disposed between the laser diode and the TO header.

18. The optical transceiver of claim 17, further comprising a plurality of electrical leads extending through the TO header, and wherein the electrical leads directly electrically couple with the laser diode submount.

* * * * *